United States Patent
Yorita et al.

(10) Patent No.: US 7,338,753 B2
(45) Date of Patent: Mar. 4, 2008

(54) METHOD FOR MANUFACTURING METAL MICROSTRUCTURE

(75) Inventors: Jun Yorita, Hyogo (JP); Yoshihiro Hirata, Hyogo (JP); Tsuyoshi Haga, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 11 days.

(21) Appl. No.: 11/503,303

(22) Filed: Aug. 14, 2006

(65) Prior Publication Data

US 2006/0276044 A1     Dec. 7, 2006

Related U.S. Application Data

(62) Division of application No. 10/492,918, filed as application No. PCT/JP02/11120 on Oct. 25, 2002, now Pat. No. 7,105,281.

(30) Foreign Application Priority Data

Oct. 29, 2001   (JP)  ............................. 2001-330652
Oct. 8, 2002   (JP)  ............................. 2002-295077

(51) Int. Cl.
    *G03F 7/039*    (2006.01)
(52) U.S. Cl. ........................ 430/320; 430/324; 205/67; 205/70
(58) Field of Classification Search .................... None
See application file for complete search history.

(56) References Cited

U.S. PATENT DOCUMENTS 4,481,279 A    11/1984   Naito et al.

(Continued)

FOREIGN PATENT DOCUMENTS

DE     3335171     4/1985

(Continued)

OTHER PUBLICATIONS

Chinese Office Action issued in corresponding Chinese Patent Application No. CN 02821630.X, dated Sep. 22, 2006.

(Continued)

*Primary Examiner*—John A. McPherson
(74) *Attorney, Agent, or Firm*—McDermott Will & Emery LLP

(57) ABSTRACT

A method of manufacturing a metal microstructure (1) by using a resin mold (13). In order to provide a method in which a mild manufacturing condition which causes less damage to the resin mold (13) can be set and the high-precision metal microstructure (1) can be mass-produced by uniform electroforming, the method of manufacturing the metal microstructure (1) according to the present invention includes the steps of: fixing on a conductive substrate (11) the resin mold (13) having a vacant portion penetrating in the direction of thickness, by interposing a photosensitive polymer (12) having a chemical composition changed by an electron beam, ultraviolet radiation or visible radiation so as to form a layered structure (2) having the resin mold (13); exposing the layered structure (2) having the resin mold (13) to an electron beam, ultraviolet radiation or visible radiation; removing an exposed photosensitive polymer (12*c*) existing at the vacant portion of the resin mold (13); and filling with a metal (14) the vacant portion of the layered structure (2) having the resin mold (13) by electroforming.

8 Claims, 2 Drawing Sheets

U.S. PATENT DOCUMENTS

| | | |
|---|---|---|
| 5,162,078 A | 11/1992 | Bley et al. |
| 5,227,280 A | 7/1993 | Jubinsky et al. |
| 5,718,618 A * | 2/1998 | Guckel et al. ................ 451/41 |

FOREIGN PATENT DOCUMENTS

| | | |
|---|---|---|
| JP | 7-323387 | 12/1995 |
| JP | 09-297391 | 11/1997 |
| JP | P2000-252185 | 9/2000 |
| JP | P2001-22089 | 1/2001 |
| JP | 2001-185531 | 7/2001 |
| JP | P2002-148817 | 5/2002 |
| JP | P2002-217461 | 8/2002 |
| WO | WO 03/037783 | 5/2003 |

OTHER PUBLICATIONS

R. Zhengwei et al. "Micromachining and Micro-processing Technologies", Northwestern Polytechnical University Press. p. 74-76, Aug. 2000.

Y. Futing, "LIGA Technology", Chinese academy of sciences doctor and graduate thesis, p. 2-4, Jan. 2000.

* cited by examiner

METHOD FOR MANUFACTURING METAL MICROSTRUCTURE

RELATED APPLICATIONS

This application is a divisional application of Ser. No. 10/492,918, filed Apr. 16, 2004, now U.S. Pat. No. 7,105,281 which is a 371 application of International Application No. PCT/JP02/11120, filed Oct. 25, 2002, which claims priority of Japanese Patent application Nos. 2001-330652, filed Oct. 29, 2001, and 2002-295077, filed Oct. 8, 2002, the contents of which are herewith incorporated by reference.

TECHNICAL FIELD

The present invention relates to a method for manufacturing a metal microstructure used for a micromachine and the like.

BACKGROUND ART

When a high-precision metal microstructure is mass-produced, a process of lithographie galvanoformung abformung (LIGA) is useful. The LIGA process, which uses synchrotron radiation (SR) ray among X-rays for its high directivity, is characterized in that it allows deep lithography, processing of a structure having a height of several hundreds of micrometers with a precision on the order of micrometers, easy manufacturing of a metal microstructure having high aspect ratio, and the like. Therefore, the LIGA process is expected to find application in various fields.

The LIGA process is a processing technique combining lithography, plating such as electroforming, and molding. According to the LIGA process, a resist film is formed on a conductive substrate, for example, and then is irradiated with SR ray through an absorbent mask having a pattern of predetermined shape to perform lithography. Such lithography allows a resist structure (resin mold) to be formed corresponding to the pattern shape of the absorbent mask. A vacant portion of the resist structure is then electroformed to obtain a metal microstructure. Furthermore, a high-precision metal microstructure obtained by further electroforming may be used as a mold to perform molding such as injection molding so as to obtain a micromolded article made of resin. For example, Japanese Patent Laying-Open No. 2002-217461 discloses a method of manufacturing a metal microstructure as a mold by the LIGA process to form a micromolded article.

However, when lithography is used to form a metal microstructure, it can produce only one resist structure (resin mold) at a time. Therefore, lithography is not suitable for mass production. Furthermore, if a resin mold to be electroformed to form a metal microstructure is not fixed firmly with high precision onto a conductive substrate with an adhesive or the like, dimensional change or separation between the resin mold and the conductive substrate occurs in a subsequent step, disadvantageously resulting in a product of lower precision, a product not suitable for commercial use, and the like. Furthermore, in the case where a typical adhesive is applied to the conductive substrate to fix the resin mold thereon so as to solve the problem of a product of lower precision and a defective product, if the adhesive remains at a vacant portion of the layered structure having the resin mold, electromolding cannot be performed or insufficiently performed thereon, disadvantageously resulting in an uneven metal layer formed thereby. Furthermore, if the entire layered structure having the resin mold is etched to remove the adhesive remaining at a vacant portion thereof, the resin mold itself is damaged accordingly to a certain degree.

An object of the present invention is to provide a method of manufacturing a metal microstructure by using a resin mold, in which a mild condition can be set so as to cause less damage to a resin mold and a high-precision metal microstructure can be mass-produced by uniform electroforming.

DISCLOSURE OF THE INVENTION

A method of manufacturing a metal microstructure according to the present invention includes the steps of: fixing on a conductive substrate a resin mold having a vacant portion penetrating in the direction of thickness, by interposing a photosensitive polymer having a chemical composition changed by one of the group consisting of an electron beam, ultraviolet radiation and visible radiation so as to form a layered structure having the resin mold; exposing the layered structure having the resin mold to the one of the group consisting of the electron beam, the ultraviolet radiation and the visible radiation; removing the exposed photosensitive polymer existing at the vacant portion of the resin mold; and filling with a metal the vacant portion of the layered structure having the resin mold by electroforming.

If the exposed photosensitive polymer is removed with a solvent, the solvent having a lower ability to solve non-exposed photosensitive polymer and the resin mold's material than the exposed photosensitive polymer is preferably used. Alternatively, if the exposed photosensitive polymer is removed by dry etching, an etching gas whose etching rate is lower for the resin mold's material than for the exposed photosensitive polymer is preferably used.

Preferably, the resin mold fixed on the conductive substrate is of a type which blocks at least 95% of an electron beam, ultraviolet radiation or visible radiation by absorption or reflection. For such a resin mold, a resin mold having the bottom surface fixed on the conductive substrate and the top surface opposite thereto, one or both of the surfaces being covered with a material absorbing or reflecting an electron beam, ultraviolet radiation or visible radiation, a resin mold containing a material absorbing or reflecting an electron beam, ultraviolet radiation or visible radiation, or a resin mold having the top surface with irregularity and slanted to prevent an electron beam, ultraviolet radiation or visible radiation from being vertically incident is preferable. For exposure, ultraviolet radiation having a wavelength of at most 300 nm is preferably used.

BEST MODES FOR CARRYING OUT THE INVENTION

A method of manufacturing a metal microstructure according to the present invention includes the steps of: fixing a resin mold on a conductive substrate, by interposing a photosensitive polymer so as to form a layered structure having the resin mold; exposing; removing the exposed photosensitive polymer; and filling with a metal a vacant portion of the layered structure having the resin mold.

For the method of manufacturing a metal microstructure according to the present invention, an embodiment thereof will schematically be shown in FIGS. 1A to 1G.

Figure 1A:
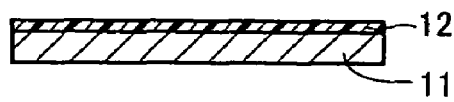
FIGS. 1A to 1G show a process illustrating a method of manufacturing a metal microstructure according to the present invention.
Figure 1B:
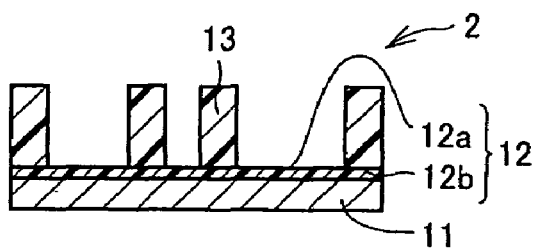

In the step of fixing a resin mold on a conductive substrate, by interposing a photosensitive polymer so as to form a layered structure having the resin mold, a photosensitive polymer layer 12 having a thickness of several micrometers is formed on a conductive substrate 11 by spin coating, for example, as shown in FIG. 1A. As shown in FIG. 1B, on photosensitive polymer layer 12, a resin mold 13 having a vacant portion penetrating in the direction of thickness is then deposited. As a result, a layered structure 2 having the resin mold is formed. Photosensitive polymer layer 12 serves to bond and fix conductive substrate 11 and resin mold 13. By fixing conductive substrate 11 and resin mold 13 firmly, lowering of precision caused by dimensional change in a subsequent step and separation of resin mold 13 from conductive substrate 11 can be prevented. In addition to the resin mold where a photosensitive polymer layer is formed on a conductive substrate and then a resin mold is fixed on the photosensitive polymer layer, as described above, the resin mold where a photosensitive polymer layer is formed on the bottom surface of a resin mold having a penetrating vacant portion and then the resin mold is fixed on a conductive substrate (not shown) may be employed.

For the photosensitive polymer, a type having a chemical composition changed by an electron beam, ultraviolet radiation or visible radiation is used. In other words, a polymer which becomes easily removable by undergoing chemical change, such as change or decomposition of the functional group thereof, by an electron beam, ultraviolet radiation or visible radiation, being rendered easily soluble to a solvent, or the like, is used. In the present invention, a photosensitive type is especially used because exposure causes chemical change which renders the polymer easily removable. As a result, a condition for the removal can be less severe, and accordingly, a resin mold can be less damaged by the removal. Similarly, a photosensitive polymer, which absorbs rays having a wavelength in the range of ultraviolet radiation (10 nm-400 nm of wavelength) or visible radiation, is used because ultraviolet radiation and visible radiation have more versatility and have smaller energy than X-ray, for example. Therefore, when such a ray of smaller energy is used as a light source for exposure, a resin mold can be less damaged. Among these rays, ultraviolet radiation having a wavelength of at most 300 nm is preferable in that the efficiency of exposure thereof is easily improved. The ultraviolet radiation having a wavelength of at most 300 nm can be obtained from an XeF lamp, or a typical mercury lamp in which a band-pass filter is inserted to block a ray having a wavelength of more than 300 nm. By using these light sources, illuminance of several mW/cm$^2$ can be obtained depending on the light source's intensity.

The photosensitive polymer used in the present invention has such photosensistivity. In addition, the photosensitive polymer has adhesion as described above and serves to fix the resin mold on the conductive substrate. More specifically, such photosensitive polymer includes phenolic resin and novolak resin. Of these resins, the type mainly composed of quinone diazide compound is preferable in that it is rendered soluble to alkaline aqueous solution after exposure. Furthermore, the thickness of the photosensitive polymer layer is preferably 1-70 μm. If the thickness thereof is less than 1 μm, sufficient adhesive strength cannot be obtained. On the other hand, if the thickness thereof is more than 70 μm, it is difficult to obtain vertical cross section thereof. Therefore, the metal microstructure obtained later must be partially removed on the side of the conductive substrate by polishing or the like.

FIG. 1A shows an example using conductive substrate 11. The thickness of the conductive substrate varies depending on its usage, ranging from only tens of micrometers to even no less than several millimeters. However, the thickness thereof is not limited thereto. Such conductive substrate 11 is formed of a material such as SUS, Al, Cu, and the like. Alternatively, a layered structure where a conductive layer is formed on a non-conductive substrate (not shown) may also be used as a conductive substrate. More particularly, a conductive layer made of Ti, Al, Cu, an alloy thereof, or the like, which is formed on a substrate made of Si, glass, ceramics, plastic, or the like, by vacuum evaporation, sputtering, plating, CVD, or the like, may be used. Alternatively, another type of thin metal film may be attached onto a conductive substrate if necessary.

Resin mold 13 fixed on conductive substrate 11 by interposing photosensitive polymer layer 12 has a vacant portion penetrating in the direction of its thickness (FIG. 1B). The resin mold serves as an absorbent mask in the next step of exposure to an electron beam, ultraviolet radiation or visible radiation. The photosensitive polymer located at the bottom of the vacant portion is exposed while the photosensitive polymer located immediately below the resin mold is protected so that adhesion between the conductive substrate and the resin mold is assured. Such a resin mold is formed of a material such as polymethyl methacrylate, polypropylene, polycarbonate, and the like.

For the resin mold, the type which blocks in the next step of exposure at least 95% of an electron beam, ultraviolet radiation or visible radiation by absorption or reflection is preferable in that it effectively serves to protect the photosensitive polymer layer located immediately below the resin mold from the electron beam, ultraviolet radiation or visible radiation. By using such a resin mold, separation of the resin mold from the substrate is prevented and a metal microstructure is easily formed in a stable manner.

For such a resin mold, a resin mold having the bottom surface fixed on the conductive substrate and the top surface opposite thereto, one or both of the surfaces being covered with a material absorbing or reflecting an electron beam, ultraviolet radiation or visible radiation, a resin mold containing a material absorbing or reflecting an electron beam, ultraviolet radiation or visible radiation, or a resin mold having the top surface slanted to prevent an electron beam, ultraviolet radiation or visible radiation from being vertically incident and having irregularity which tends to cause scattered reflection, is preferable. A resin mold formed by a combination of these types as such, as appropriate is effective, including a manner where absorption is weighed, a manner where reflection is weighed, and a manner where both absorption and reflection are weighed. Furthermore, these manners are also effective in the case where the resin mold is so thin that it does not sufficiently serve as an absorbent mask.

For the resin mold having one or both of the top and bottom surfaces covered with a material absorbing or reflecting an electron beam, ultraviolet radiation or visible radiation, the material forms a layer serving as a light exclusion layer to protect the photosensitive polymer immediately below the resin mold. If the layer made of a material which absorbs or reflects an electron beam, ultraviolet radiation or visible radiation is provided on the top layer or the bottom layer, the layer provided at the bottom layer will serve more effectively. The shorter the distance between the photosensitive polymer layer and the layer made of a material which absorbs or reflects an electron beam, ultraviolet radiation or visible radiation, the larger effect of protecting the photosensitive polymer immediately below the resin mold can be obtained because wraparound by diffraction of an electron beam, ultraviolet radiation or visible radiation is decreased. For the material absorbing or reflecting an electron beam, ultraviolet radiation or visible radiation, a metal such as Al, Ti, Cu, Cr, Au, Ni and Ag, a metal compound such as $Cr_2O_3$ and tungsten nitride (WN), or ceramics such as $SiO_2$, $Al_2O_3$, SiC and AlN can be used. For the method of forming the light exclusion layer on the top and bottom surfaces of the resin mold, various types of methods including sputtering, vapor deposition, and the like, can be adopted.

The resin mold containing a material absorbing or reflecting an electron beam, ultraviolet radiation or visible radiation is also preferable in that it effectively serves to block an electron beam, ultraviolet radiation or visible radiation and protect the photosensitive polymer immediately below the resin mold. For the material absorbing or reflecting an electron beam, ultraviolet radiation or visible radiation, the metal, metal compound, or ceramics described above can be used. Alternatively, a chlorant, an ultraviolet absorbent, or the like, can also be used. Furthermore, the resin mold containing a material absorbing or reflecting an electron beam, ultraviolet radiation or visible radiation also includes a resin mold itself made of a material absorbing or reflecting an electron beam, ultraviolet radiation or visible radiation. As mentioned above, ultraviolet radiation having a wavelength of at most 300 nm is preferably used to perform exposure. An example of the resin absorbing ultraviolet radiation having a wavelength of at most 300 nm is SAN-RAD UXC-201 (made by Sanyo Chemical Industries, Ltd.). The resin mold made of SANRAD UXC-201 has high absorptance for ultraviolet radiation having a wavelength of at most 300 nm, and if the thickness of the resin mold is reduced, at least 95% of ultraviolet radiation can easily be blocked. Therefore, ultraviolet radiation can easily be blocked and the thickness of the resin mold can also be reduced without covering the top surface or the bottom surface of the resin mold with an ultraviolet absorbent, providing irregularity to the top surface to obtain a rough surface, or adding an ultraviolet absorbent to the resin mold.

Preferably, the top surface of the resin mold has irregularity and is slanted to prevent an electron beam, ultraviolet radiation or visible radiation from being vertically incident. By slanting the top surface of the resin mold to prevent an electron beam, ultraviolet radiation or visible radiation from being vertically incident, a larger quantity of light can be reflected and the photosensitive polymer immediately below the resin mold can be protected more effectively. As long as a larger quantity of light can be reflected, the top surface's angle can be adjusted as appropriate in view of manufacturability. Furthermore, if the top surface is made rough with irregularity, a quantity of the light passing through the resin mold can be reduced by scattered reflection to protect the photosensitive polymer immediately below the resin mold. Such a rough surface can be formed by sputtering, or alternatively, by mechanical processing with sandpaper, for example. In order to allow scattered reflection to effectively decrease the quantity of light passing through, the surface roughness (roughness of arithmetic mean Ra) of the top surface of the resin mold is preferably at least 1 µm.

Figure 1C:
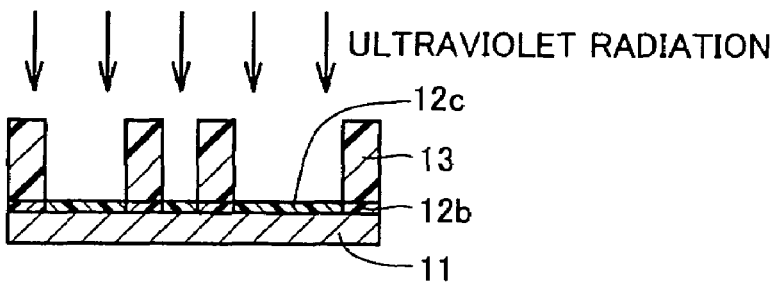

In the step of exposure, the layered structure having the resin mold is irradiated with an electron beam, ultraviolet radiation or visible radiation for 1-10 minutes for exposure. If the photosensitive polymer is applied on the conductive substrate and the resin mold is then attached thereon, a photosensitive polymer layer 12a exists at the bottom of the vacant portion of the layered structure 2 having the resin mold as shown in FIG. 1B. Alternatively, if the photosensitive polymer is applied to the bottom of the resin mold and then the resin mold is fixed on the conductive substrate (not shown), excessive photosensitive polymer overflows at the bottom of the vacant portion of the layered structure having the resin mold after the fixing step. In the step of exposing the layered structure having the resin mold, resin mold 13 itself serves as an absorbent mask as shown in FIG. 1C so that photosensitive polymer 12a at the bottom of the vacant portion of the layered structure having the resin mold is exposed to change into a polymer 12c having a chemical composition allowing easy removal by a solvent or by dry etching.

Figure 1D:
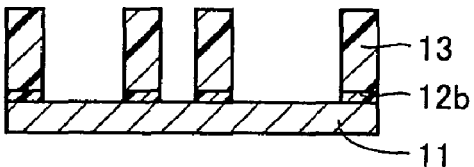

The step of removing the exposed polymer can be performed by a solvent or by dry etching. FIG. 1D shows the state in which the exposed polymer at the bottom of the vacant portion of the resin mold is removed. By this step, a clean metal surface of the conductive substrate appears at the vacant portion of the layered structure having the resin mold. As a result, the vacant portion of the layered structure having the resin mold can be filled with a metal uniformly in the next step of electroforming so as to obtain a high-precision metal microstructure.

In the step of removing the exposed polymer with a solvent, in order to completely remove the exposed polymer from the bottom of the vacant portion of the layered structure having the resin mold and to protect the resin mold and the non-exposed polymer immediately below the resin mold, a solvent (liquid developer) having a lower ability to solve the non-exposed photosensitive polymer and the resin mold's material than the exposed polymer is preferably used. The ability to solve the resin mold's material is preferably at most 5% by weight, and more preferably, at most 3% by weight of the ability to solve the exposed polymer. For example, if phenolic resin, novolak resin or dry film resist is used for the photosensitive polymer, a solvent (liquid developer) alkaline to a certain degree which does not affect the resin mold is preferably used. More particularly, if PMER P-LA100PM made by TOKYO OHKA CO., LTD. is used as a photosensitive polymer, PMER P-7G also made by TOKYO OHKA CO., LTD. is preferably used as an etching liquid.

In the step of removing the exposed polymer by dry etching, in order to completely remove the exposed polymer at the bottom of the vacant portion of the layered structure having the resin mold and to protect the resin mold, an etching gas whose etching rate is lower for the resin mold's material than for the exposed polymer is preferably used. The etching rate is a rate of removing a target by physical and chemical effects of an etching gas. For the material used for the resin mold, a resin resistant to dry etching, such as polyplopylene, polycyclic aromatic resin, or the like, is preferable. If phenolic resin or novolak resin of low molecular weight is used for the photosensitive polymer, Ar, $SF_6$, $O_2$, $CF_4$, or a mixture thereof, for example, is preferable for an etching gas.

Furthermore, the etching is preferably performed with RF power set to 10 W-400 W, and with the conductive substrate cooled to 0° C. to −100° C. If the conductive substrate is kept at high temperature, the resin mold and the non-exposed polymer immediately below the resin mold as well tend to suffer from erosion by lateral etching. If the conductive substrate is kept at low temperature ranging 0° C. to −100° C., erosion of the non-exposed polymer immediately below the resin mold can be suppressed and selective etching only in the direction of a depth of the resin mold can be achieved. In the removing step, dry etching is superior to the use of a solvent described above in that dry etching involves a smaller number of steps and does not require a large number of washing steps, for example, because of its dryness.

Figure 1E:
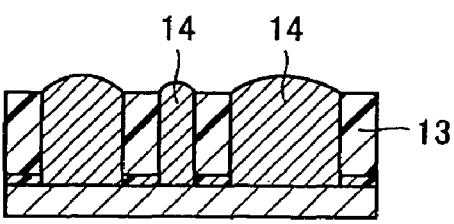
Figure 1F:
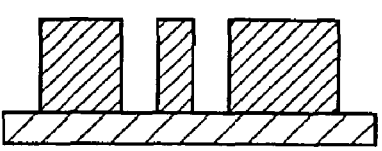
Figure 1G:
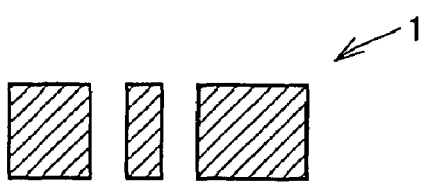

After removing the exposed polymer, the vacant portion of the layered structure having the resin mold is filled with a metal by electroforming. FIG. 1E shows the resin mold filled with a metal. Electroforming is a process of forming a metal layer 14 on the conductive substrate by using a metal-ion solution. After forming metal layer 14, the metal layer is polished or ground to have a predetermined, uniform thickness. The metal microstructure obtained as such can be used for a circuit board, for example, with the conductive substrate placed thereon. Alternatively, the metal microstructure from which the conductive substrate is removed may also be used by itself.

The resin mold on the conductive substrate is removed by ashing using oxygen plasma, or the like. As a result, a structure shown in FIG. 1F can be obtained. By removing the conductive substrate from the structure, a metal microstructure 1 shown in FIG. 1G can be obtained. Metal microstructure 1 is a structure having a width of several micrometers to several hundreds of micrometers, a height of at most several hundreds of micrometers, and high aspect ratio. Furthermore, a sophisticated structure can be formed and the assembly work for the components is not required. The resin mold as mentioned above can be mass-replicated from a metal mold formed by the LIGA process, for example, and the resin mold can be electroformed to mass-produce the metal microstructure.

Figure 2A:
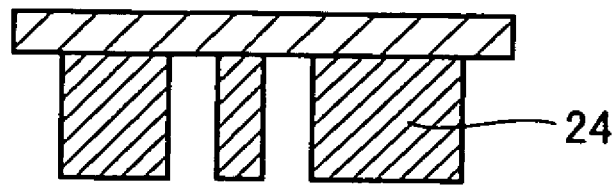
FIGS. 2A to 2D show a process illustrating a method of manufacturing a resin mold.
Figure 2B:
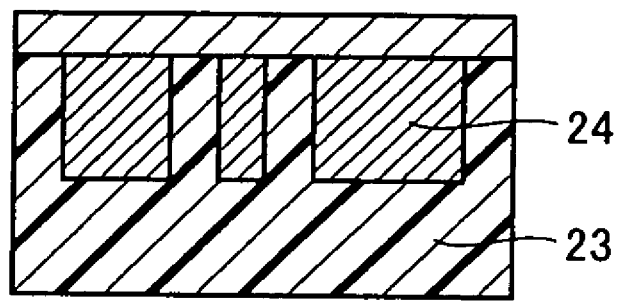
Figure 2C:
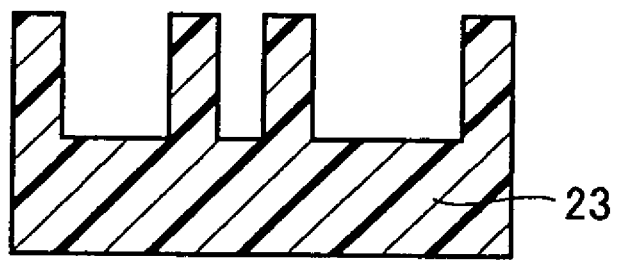
Figure 2D:

For a method of manufacturing the resin mold, an embodiment thereof is illustrated in FIGS. 2A to 2D. FIG. 2A shows a metal mold having a convex portion 24. Such a metal mold is used to perform molding such as injection molding so as to form a resin mold 23 having a concave portion as shown in FIG. 2B. FIG. 2C shows resin mold 23 having a concave portion, from which the metal mold is removed. The resin mold is formed of a material such as polymethyl methacrylate, polypropylene, polycarbonate, or the like. In addition to molding such as injection molding, the resin mold having a concave portion may also be formed by heat curing or photocuring. In this case, the resin mold is formed of a material such as acrylic resin, epoxy resin, or the like. When resin mold 23 is polished, a resin mold 23a having a hole penetrating in the direction of a thickness as shown in FIG. 2D. Alternatively, the resin mold may be polished after it is bonded on the conductive substrate.

The example and embodiment herein disclosed are to be considered as illustrative and not to be considered as limitative in any aspect. The scope of the present invention is represented not by the description above but by the scope of the claims, and meanings equivalent to the scope of the claims and all modifications within the scope thereof are intended to be included.

INDUSTRIAL APPLICABILITY

According to the present invention, by using a resin mold, a high-precision metal microstructure can be mass-produced under the mild manufacturing condition which causes less damage to the resin mold.

The invention claimed is:

1. A method of manufacturing a metal microstructure comprising the steps of:
    forming a resin mold having a concave portion;
    attaching on a conductive substrate a concave surface of said resin mold having a concave portion by interposing a photosensitive polymer having a chemical composition changed by one of the group consisting of an electron beam, ultraviolet radiation and visible radiation so as to form a layered structure having said resin mold;
    polishing said resin mold having a concave portion so as to form a resin mold having a vacant portion penetrating in direction of thickness;
    exposing said layered structure having said resin mold to said one of the group consisting of said electron beam, said ultraviolet radiation and said visible radiation;
    removing an exposed photosensitive polymer existing at the vacant portion of said resin mold; and
    filling with a metal the vacant portion of said layered structure having said resin mold by electroforming.

2. The method of manufacturing a metal microstructure according to claim 1, wherein, in the step of removing the exposed photosensitive polymer existing at the vacant portion of said resin mold, a solvent having a lower ability to solve a non-exposed photosensitive polymer and a material for the resin mold than the exposed photosensitive polymer is used for removal.

3. The method of manufacturing a metal microstructure according to claim 1, wherein, in the step of removing the exposed photosensitive polymer existing at the vacant portion of said resin mold, an etching gas having an lower etching rate for the resin mold than for the exposed photosensitive polymer is used for dry etching.

4. The method of manufacturing a metal microstructure according to claim 1, wherein said penetrated resin mold blocks at least 95% of said one of the group consisting of said electron beam, said ultraviolet radiation and said visible radiation by absorption or reflection.

5. The method of manufacturing a metal microstructure according to claim 4, wherein said penetrated resin mold has a bottom surface fixed on the conductive substrate and a top surface opposite to said bottom surface, at least one of the surfaces being covered with a material absorbing or reflecting said one of the group consisting of said electron beam, said ultraviolet radiation and said visible radiation.

6. The method of manufacturing a metal microstructure according to claim 4, wherein said penetrated resin mold contains a material absorbing or reflecting said one of the group consisting of said electron beam, said ultraviolet radiation and said visible radiation.

7. The method of manufacturing a metal micro structure according to claim 4, wherein the top surface of said penetrated resin mold has irregularity and is slanted to prevent said one of the group consisting of said electron beam, said ultraviolet radiation and said visible radiation from being vertically incident.

8. The method of manufacturing a metal microstructure according to claim 4, wherein said ultraviolet radiation has a wavelength of at most 300 nm.

* * * * *